United States Patent
Tawara et al.

(10) Patent No.: US 10,522,667 B2
(45) Date of Patent: Dec. 31, 2019

(54) SILICON CARBIDE EPITAXIAL WAFER, SILICON CARBIDE INSULATED GATE BIPOLAR TRANSISTOR, AND METHOD OF MANUFACTURING THE SAME

(71) Applicant: FUJI ELECTRIC CO., LTD., Kawasaki (JP)

(72) Inventors: Takeshi Tawara, Tsukuba (JP); Hidekazu Tsuchida, Yokosuka (JP); Koichi Murata, Yokosuka (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 15/963,698

(22) Filed: Apr. 26, 2018

(65) Prior Publication Data
US 2018/0315842 A1 Nov. 1, 2018

(30) Foreign Application Priority Data
Apr. 28, 2017 (JP) .................. 2017-089845

(51) Int. Cl.
| | |
|---|---|
| *H01L 29/739* | (2006.01) |
| *H01L 29/16* | (2006.01) |
| *H01L 21/02* | (2006.01) |
| *H01L 29/66* | (2006.01) |
| *H01L 29/36* | (2006.01) |
| *H01L 29/10* | (2006.01) |

(52) U.S. Cl.
CPC ...... *H01L 29/7395* (2013.01); *H01L 21/0262* (2013.01); *H01L 21/02378* (2013.01); *H01L 21/02433* (2013.01); *H01L 21/02447* (2013.01); *H01L 21/02529* (2013.01); *H01L 21/02579* (2013.01); *H01L 29/1095* (2013.01); *H01L 29/1608* (2013.01); *H01L 29/36* (2013.01); *H01L 29/66068* (2013.01)

(58) Field of Classification Search
None
See application file for complete search history.

(56) References Cited

U.S. PATENT DOCUMENTS

| | | | |
|---|---|---|---|
| 3,798,079 A * | 3/1974 | Chu | .......... H01L 23/3157 148/33.5 |
| 2015/0087125 A1 * | 3/2015 | Nishio | .......... H01L 21/02636 438/285 |

OTHER PUBLICATIONS

J.J. Sumakeris et al., "Approaches to Stabilizing the Forward Voltage of Bipolar SiC Devices", (USA), Materials Science Forum, Online vol. 457-460, 2004, pp. 1113-1116.

* cited by examiner

*Primary Examiner* — Ali Naraghi

(57) ABSTRACT

The SiC-IGBT includes a p-type collector layer, an n⁻-type voltage-blocking-layer provided on the collector layer, p-type base regions provided on the n⁻-type voltage-blocking-layer, n⁺-type emitter regions provided in an upper portion of the p-type base region, a gate insulating film provided in an upper portion of the voltage-blocking-layer, and a gate electrode provided on the gate insulating film. The p-type buffer layer has thickness of five micrometers or more and 20 micrometers or less and is doped with Al at impurity concentration of $5\times10^{17}$ cm$^{-3}$ or more and $5\times10^{18}$ cm$^{-3}$ or less and doped with B at impurity concentration of $2\times10^{16}$ cm$^{-3}$ or more and less than $5\times10^{17}$ cm$^{-3}$.

11 Claims, 8 Drawing Sheets

SILICON CARBIDE EPITAXIAL WAFER, SILICON CARBIDE INSULATED GATE BIPOLAR TRANSISTOR, AND METHOD OF MANUFACTURING THE SAME

CROSS REFERENCE TO RELATED APPLICATIONS AND INCORPORATION BY REFERENCE

This application claims benefit of priority under 35 USC 119 based on JP2017-089845 filed on Apr. 28, 2017, the entire contents of which are incorporated by reference herein.

BACKGROUND OF THE INVENTION

1. Field of the Invention

The present invention relates to a silicon carbide (SiC) insulated gate bipolar transistor (IGBT), an epitaxial wafer for an SiC-IGBT, a method for manufacturing the epitaxial wafer, and a method for manufacturing the SiC-IGBT.

2. Description of the Related Art

A lot of crystal defects and dislocations exist in an epitaxial wafer obtained by epitaxially growing SiC on an SiC substrate. The crystal defects and dislocations are considered to make have adverse effects on the characteristics of SiC semiconductor devices. In particular, a basal plane dislocation (BPD) in an epitaxial growth layer expands to a stacking fault (SF) in a bipolar operation in the semiconductor device and a current is less likely to flow. Therefore, an on-state voltage of the semiconductor device increases and the BPD causes that "bipolar degradation" occurs.

Several hundreds to several thousands of BPDs exist per square centimeter in the substrate. Most of the BPDs are converted into threading edge dislocations (TEDs) during epitaxial growth. However, a problem that the remaining BPDs penetrate up to at a surface and expand to be in triangular-shaped stacking faults occurs. The problem is being solved by improving epitaxial growth conditions to increase the efficiency of the conversion such that almost all of the BPDs are converted. However, in recent years, an expansion of a stacking fault into a bar shape has been reported, which causes a new problem for practical use of the SiC semiconductor device in which a bipolar operation occurs. (J. J. Sumakeris et al., "Approaches to Stabilizing the Forward Voltage of Bipolar SiC Devices", USA, Materials Science Forum, Online 457-460, 2004, pp. 1113-1116)

In J. J. Sumakeris et al., a recombination electrons and holes in the semiconductor substrate is pointed as a factor which causes the expansion of the bar-shaped stacking fault. And, a scheme to increase the thickness of a buffer layer, which is epitaxially grown on a semiconductor substrate of a semiconductor device to prevent an excessively large number of holes from being injected into the semiconductor substrate, so as to suppress the recombination, is disclosed. However, growing the thick buffer layer is not preferable, because costs increase owing to reduction of throughput of the process for epitaxial growth, and yield is reduced owing to increase of the defect density, and further, the resistance of the epitaxial wafer increases. Therefore, a technique to prevent the bar-shaped stacking fault is required, minimizing thickness of the buffer layer.

SUMMARY OF THE INVENTION

According to an analysis by the inventors, as to the above-mentioned bipolar degradation phenomenon, because BPDs which exist in the substrate serves as a starting point and excessive holes are injected into the BPD's position, stacking faults are expanded. Furthermore, as a result of test examination by the inventors, even in an insulated gate bipolar transistor (IGBT) using a self-supporting epitaxial film obtained by growing an epitaxial growth layer and removing a substrate, a similar bipolar degradation phenomenon occurs in forward electric conduction. In the case of an IGBT using a self-supporting epitaxial film, as to the bipolar degradation phenomenon, BPDs exist in scratches or damaged portions which are caused in removing substrate. Because the BPDs serves as a starting point and excessive electrons are injected into the starting point in the vicinity of a collector electrode in the BPDs, stacking faults are expanded.

The present invention has been made in view of the above-mentioned problems and an object of the present invention is to provide a silicon carbide epitaxial wafer which can effectively prevent the occurrence of stacking faults that are expanded due to excessive electrons injected in the vicinity of a collector electrode during forward operation of an IGBT using a self-supporting epitaxial film, a silicon carbide insulated gate bipolar transistor using the silicon carbide epitaxial wafer, a method of manufacturing the silicon carbide epitaxial wafer, and a method of manufacturing the silicon carbide insulated gate bipolar transistor.

In order to solve the above-mentioned problems, an aspect of a silicon carbide insulated gate bipolar transistor according to the present invention includes, a p-type collector layer being silicon carbide, the collector layer having thickness of five micrometers or more and 20 micrometers or less, the collector layer being doped with aluminum at impurity concentration of $5 \times 10^{17}$ cm$^{-3}$ or more and $5 \times 10^{18}$ cm$^{-3}$ or less, and being doped with boron at impurity concentration of $2 \times 10^{16}$ cm$^{-3}$ or more and less than $5 \times 10^{17}$ cm$^{-3}$, an n-type voltage-blocking-layer being provided on the collector layer, a p-type base region being provided on the voltage-blocking-layer, an n-type emitter region being provided in an upper portion of the base region, a gate insulating film being provided in an upper portion of the voltage-blocking-layer, and a gate electrode being provided on the gate insulating film, wherein the boron doped into the collector layer enhances capturing and extinction of electrons as a minority-carrier.

And an aspect of a silicon carbide epitaxial wafer according to the present invention includes, a substrate being silicon carbide, and a p-type buffer layer being provided on the substrate, the buffer layer having thickness of five micrometers or more and 20 micrometers or less, the buffer layer having a collector region which is doped with aluminum at impurity concentration of $5 \times 10^{17}$ cm$^{-3}$ or more and $5 \times 10^{18}$ cm$^{-3}$ or less and which is doped with boron at impurity concentration of $2 \times 10^{16}$ cm$^{-3}$ or more and less than $5 \times 10^{17}$ cm$^{-3}$, wherein the boron doped into in the buffer layer enhances capturing and extinction of electrons as a minority-carrier.

And an aspect of a method of manufacturing a silicon carbide epitaxial wafer according to the present invention includes, forming a p-type buffer layer being silicon carbide as a collector region on a substrate by doping aluminum and boron, so that the buffer layer has thickness of five micrometers or more and 20 micrometers or less, so that the buffer layer is doped with the aluminum at impurity concentration of $5 \times 10^{17}$ cm$^{-3}$ or more and $5 \times 10^{18}$ cm$^{-3}$ or less and is doped with the boron at impurity concentration of $2 \times 10^{16}$ cm$^{-3}$ or more and less than $5 \times 10^{17}$ cm$^{-3}$, wherein the boron doped into the buffer layer enhances capturing and extinction of electrons as a minority-carrier.

And an aspect of a method of manufacturing a silicon carbide insulated gate bipolar transistor according to the present invention uses a silicon carbide epitaxial wafer which includes a substrate and a p-type buffer layer which is silicon carbide as a collector layer. The silicon carbide epitaxial wafer is manufactured by the method of manufacturing a silicon carbide epitaxial wafer according to the above aspect of the method of manufacturing the silicon carbide insulated gate bipolar transistor. The aspect of a method of manufacturing a silicon carbide insulated gate bipolar transistor includes, removing the substrate, forming an n-type voltage-blocking-layer on the collector layer, forming a p-type base region on the voltage-blocking-layer, forming an n-type emitter region in an upper portion of the base region, forming a gate insulating film in an upper portion of the voltage-blocking-layer, and forming a gate electrode on the gate insulating film, wherein the boron doped into the collector layer enhances capturing and extinction of electrons as a minority-carrier.

DETAILED DESCRIPTION OF THE PREFERRED EMBODIMENTS

Figure 1:
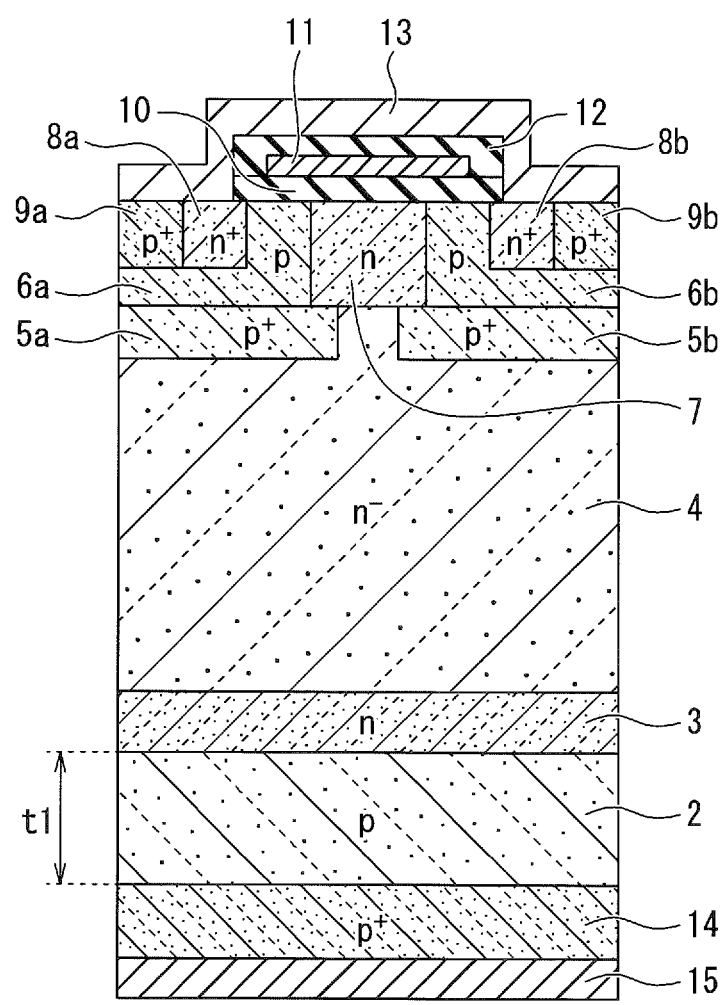
FIG. 1 is a cross-sectional view schematically illustrating an outline of a silicon carbide insulated gate bipolar transistor according to a first embodiment.

Hereinafter, First and second embodiments of the present invention will be described. In the following description of the drawings, the same or similar components are denoted by the same or similar reference numerals. However, it should be noted that the drawings are schematic, a relationship between thickness and planar dimensions, a ratio of thickness of each device and each member, and the like are different from actual ones. Therefore, specific thicknesses and dimensions should be determined with reference to the following description. In addition, the relationships and ratios of dimensions may be different among figures.

In addition, in the following description, the "left-right" directions and the "up-down" directions are defined simply for the convenience of description and do not limit the technical spirit of the present invention. Therefore, for example, when the plane of paper is rotated 90 degrees, the "left-right" direction is changed to the "up-down" direction, and the "up-down" direction is changed to the "left-right" direction. When the plane of paper is rotated 180 degrees, the "left" side is changed to the "right" side, and the "right" side is changed to the "left" side. In addition, symbols "+" and "−" added to n or p of a semiconductor region denote that the impurity concentration (impurity density) of the semiconductor region is higher or lower than that of a semiconductor region without the symbols "+" and "−", respectively.

First Embodiment

<Silicon Carbide Insulated Gate Bipolar Transistor>

A silicon carbide insulated gate bipolar transistor according to a first embodiment (hereinafter, also referred to as a "first SiC-IGBT") will be described with reference to FIG. 1. The first SiC-IGBT includes a p-type buffer layer 2 doped with Al and B, an n-type field stop layer 3 provided on the p-type buffer layer 2, and an n$^-$-type voltage-blocking-layer 4 provided on the n-type field stop layer 3.

The n-type field stop layer 3 is doped with nitrogen (N) or the like at higher impurity concentration than impurity concentration (hereinafter, also referred to simply as "concentration") of the n$^-$-type voltage-blocking-layer 4. The n-type voltage-blocking-layer 4 is doped with N or the like at about $1 \times 10^{15}$ cm$^{-3}$ or less. The thickness of the n$^-$-type voltage-blocking-layer 4 is appropriately determined depending on a predetermined breakdown voltage. For example, if the first SiC-IGBT has a breakdown voltage of 13 kV to 20 kV, the thickness may be set to 100 micrometers to 250 micrometers or the like.

Furthermore, the first SiC-IGBT includes a plurality of p$^+$-type first base regions 5a, 5b selectively provided in an upper portion of the n$^-$-type voltage-blocking-layer 4, and a plurality of p-type second base regions 6a, 6b provided on the p$^+$-type first base regions 5a, 5b. In addition, the first SiC-IGBT includes a plurality of n$^+$-type emitter regions 8a, 8b selectively provided in an upper portion of the p-type second base regions 6a, 6b and a plurality of p$^+$-type first contact regions 9a, 9b selectively provided in the upper portion of the p-type second base regions 6a, 6b.

As illustrated in FIG. 1, an n-type base region 7 as a conducting tab-region is provided between the adjacent p-type second base regions 6a, 6b on the upper portion of the n$^-$-type voltage-blocking-layer 4. A top surface of the n$^-$-type voltage-blocking-layer 4, which is located between the p$^+$-type first base region 5a and the first base region 5b that are locally disposed in the upper portion of the n$^-$-type voltage-blocking-layer 4 respectively, and the bottom surface of the n-type base region 7 contact each other.

A gate electrode 11 is provided on a gate insulating film 10 which is disposed both on the p-type second base regions 6a, 6b and the n-type base region 7. An interlayer dielectric 12 is provided on the gate electrode 11, and an emitter electrode 13 is provided on the interlayer dielectric 12, on top surfaces of the n$^+$-type emitter regions 8a, 8b, and the p$^+$-type first contact regions 9a, 9b. In addition, on a bottom surface of the p-type buffer layer 2 on the side opposite to the n$^-$-type voltage-blocking-layer 4, a p$^+$-type second contact region 14 is provided, and a collector electrode 15 is provided on a bottom surface of the p⁺-type second contact region 14.

The concentration of Al which is the main dopant in the p-type buffer layer 2 is set to a range of about $5\times10^{17}$ cm$^{-3}$ or more and about $5\times10^{18}$ cm$^{-3}$ or less. Since the p-type buffer layer 2 functions as a collector layer of the IGBT, in a case that the Al concentration is lower than $5\times10^{17}$ cm$^{-3}$, holes are not injected sufficiently into the n⁻-type voltage-blocking-layer 4, and the resistance of the IGBT element is increased. On the other hand, in a case that the Al concentration is higher than $5\times10^{18}$ cm$^{-3}$, problems that a surface of the epitaxial growth film is roughened and that the Al remains in the epitaxial furnace, will occur. Furthermore, when the n-type field stop layer 3 is provided on the p-type buffer layer 2, interface dislocation defects are introduced due to the difference in lattice constants of the respective layers.

The B concentration, which is an auxiliary dopant of the p-type buffer layer 2, is set to a range of about $2\times10^{16}$ cm$^{-3}$ or more and less than about $5\times10^{17}$ cm$^{-3}$. In a case that the B concentration is lower than $2\times10^{16}$ cm$^{-3}$ and does not reach at the lower limit value, minority-carrier is not captured sufficiently, and it is not possible to effectively prevent the occurrence of bar-shaped stacking faults. On the other hand, if the B concentration becomes excessively higher than $5\times10^{17}$ cm$^{-3}$, a problem that B remains in the epitaxial growth furnace will occur.

Here, in the determining of specifications of the minority-carrier lifetime, thickness, Al concentration, and B concentration of the p-type buffer layer 2, results obtained in advance by the inventors will be specifically described. First, an epitaxial growth film are epitaxially grown so as to be doped with B and Al together, and the inventors examined effectiveness of reducing the minority-carrier lifetime by co-doping B and Al. As a result of the examination, the inventors found that the minority-carrier lifetime "τ" at 250° C. is represented by the following Mathematical Formula (1).

$$1/\tau[\mu s^{-1}] = 1/\tau_{Al}[\mu s^{-1}] + 6.9\times10^{16}\times P_B \quad (1)$$

$P_B$: Boron concentration

Figure 2:
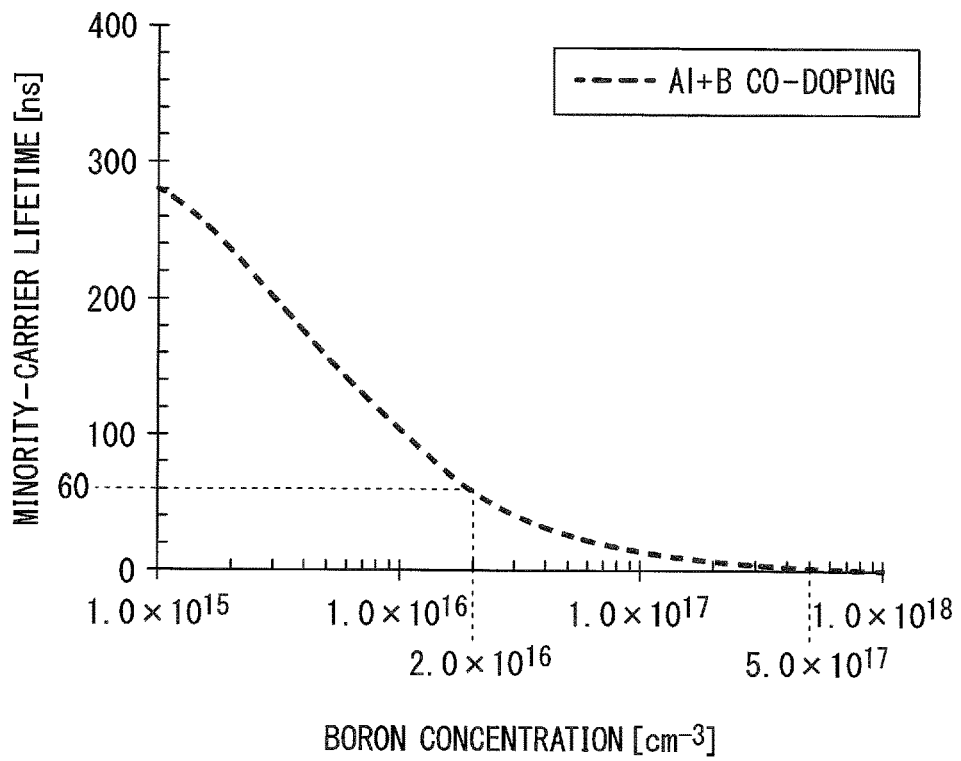
FIG. 2 is a graph illustrating dependency of minority-carrier lifetime on a B doping concentration when aluminum (Al) and boron (B) are doped simultaneously (co-doped)

In the Mathematical Formula (1), "$\tau_{Al}$" means the minority-carrier lifetime at 250° C. in a case that only Al is doped. Here, that the minority-carrier lifetime is decreased in response to increase of the Al concentration is generally known. However, it is actually difficult to excessively increase the Al concentration because of problems such that a surface of the epitaxial growth film is roughened or the Al remains in the furnace. Therefore, the minority-carrier lifetime which is aimed from the viewpoint in design safety requested is set to about 350 nanoseconds at 250° C., as a lower limit value. FIG. 2 illustrates a result of calculation of a relationship between an amount of doped B and minority-carrier lifetime when the value of 350 nanoseconds is used for "$\tau_{Al}$" in Mathematical Formula (1). As illustrated in FIG. 2, the minority-carrier lifetime can be controlled over a wide range by the amount of doped B.

On the other hand, the inventors also examined how long the minority-carrier lifetime is sufficient to prevent the occurrence of stacking faults. First, a p-n diode with a patterned electrode, in which emission of light can be observed at the time of forward electric conduction, was prepared. And electron density was examined when stacking faults expand from inside of the p-type layer, while changing the current flowing through the p-n diode and temperature of the p-n diode. As a result of the examination, the stacking fault starts to expand when the electron density exceeds a certain threshold value of about $2\times10^{15}$ cm$^{-3}$ by increasing the current and the temperature.

Figure 3:
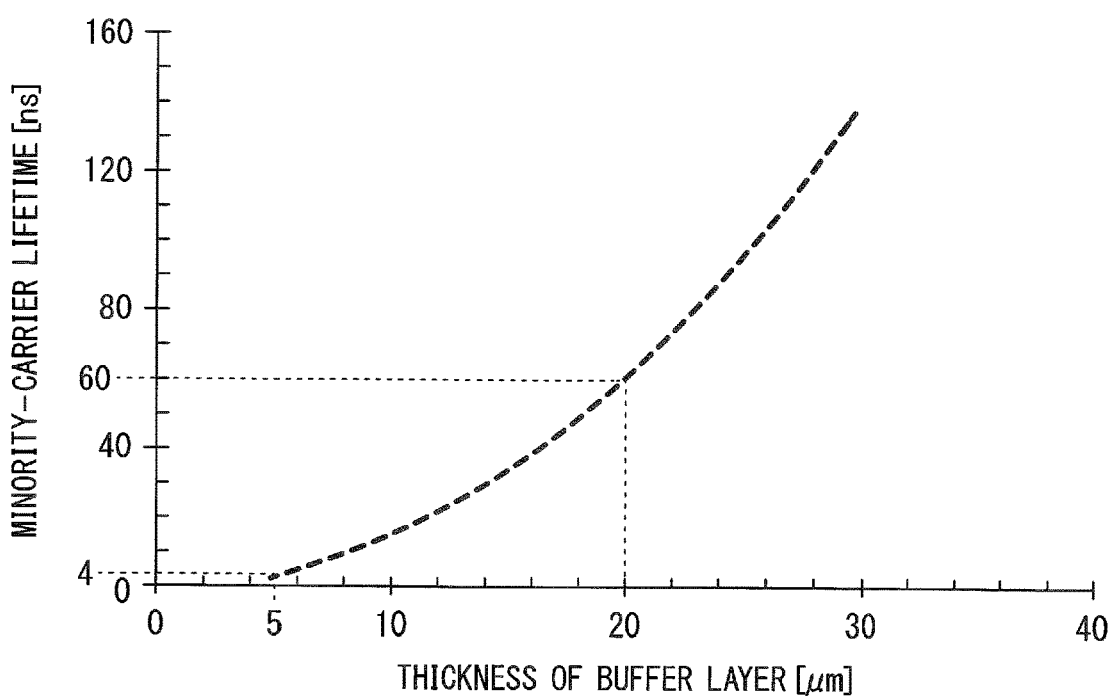
FIG. 3 is a graph illustrating a relationship between minority-carrier lifetime and thickness of a buffer layer required to prevent expansion of SF.

The inventors calculated a relationship between the thickness t1 of the p-type buffer layer 2 and the required minority-carrier lifetime by use of both data of the threshold values of the electron density and the acquired minority-carrier lifetime, while taking a maximum amount of electron injected during operation of an actual device as semiconductor devices into consideration. As illustrated in the result of the calculation in FIG. 3, the shorter the minority-carrier lifetime is, the thinner the required thickness t1 of the p-type buffer layer 2 is.

In a case that the p-type buffer layer 2 is implemented by the method of grinding an epitaxial growth film epitaxially grown on the n⁺-type substrate 1 together with the n⁺-type substrate 1, the thickness of the epitaxial growth film including the p-type buffer layer 2 is preferable to be about 15 micrometers or more and 30 micrometers or less. In a case that the thickness of the p-type buffer layer 2, which is an epitaxial growth film, is too thin, a problem that the capturing of minority-carriers is insufficient and the occurrence of bar-shaped stacking faults cannot be effectively prevented, and when the substrate 1 is ground or polished to be removed at the manufacturing IGBT process, the n⁺-type substrate 1 might be lost. Since variation in the thickness of the n⁺-type substrate 1 exists, a certain region with thickness of about ten micrometers as a stock allowance for grinding is needed when the n⁺-type substrate 1 is removed. Therefore, the thickness of about five micrometers to about 20 micrometers excluding the stock allowance is finally required as the thickness t1 of the p-type buffer layer 2. On the other hand, in a case that the p-type buffer layer 2 which is an epitaxial growth film is too thick, the growth-time of the p-type buffer layer 2 as an epitaxial growth film is increased much, and then, a problem that the manufacturing cost is increased and a problem that roughness of the surface and the defect density are increased, will occur.

According to the results of the calculation, in a case that the thickness t1 is about 20 micrometers, that minority-carrier lifetime is required to be less than about 60 nanoseconds. In addition, with reference to FIG. 2, the B concentration is required to be about $2\times10^{16}$ cm$^{-3}$ or more so that less than about 60 nanoseconds of the minority-carrier lifetime is obtained.

Due to the above examination results, with respect to the p-type buffer layer 2 of the first SiC-IGBT, the Al concentration and the B concentration to be doped and the thickness t1 are adjusted so as to simultaneously satisfy the values within the following ranges.

Al concentration: about $5\times10^{17}$ cm$^{-3}$ or more and about $5\times10^{18}$ cm$^{-3}$ or less B concentration: about $2\times10^{16}$ cm$^{-3}$ or more and less than about $5\times10^{17}$ cm$^{-3}$ Thickness t1: about five micrometers or more and about 20 micrometers or less By the SiC-IGBT according to the first embodiment, the thickness t1, the Al concentration, and the B concentration of the p-type buffer layer 2 are simultaneously controlled to be values within a certain range so as to aggressively reduce minority-carriers. Therefore, in the forward operation of the IGBT using the self-supporting epitaxial film, even in a bipolar operation with a large current, excessive electrons are not injected into the vicinity of the collector electrode 15, and it is possible to manufacture an SiC-IGBT which can effectively prevent the occurrence of stacking faults expanding from the vicinity of the collector electrode 15.

<Method of Manufacturing Silicon Carbide Insulated Gate Bipolar Transistor>
[Silicon Carbide Epitaxial Wafer]

First, a silicon carbide epitaxial wafer prepared as a semiconductor wafer for manufacturing the first SiC-IGBT (hereinafter, referred to as a "first SiC epitaxial wafer") will be described with reference to FIG. 4.

Figure 4:
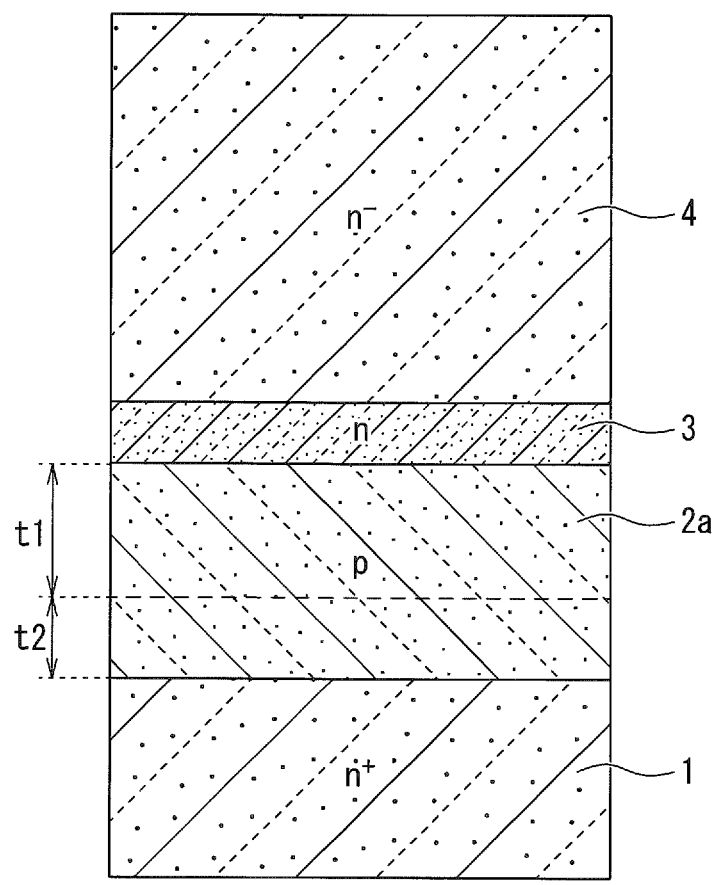
FIG. 4 is a cross-sectional view schematically illustrating an outline of a silicon carbide epitaxial wafer according to a first embodiment.

The first SiC epitaxial wafer (1, 2a, 3, 4) is entirely made of an SiC semiconductor, and as illustrated in FIG. 4, an n$^+$-type substrate 1 doped with N etc. is provided in the lower portion. A p-type buffer-layer region 2a, which is epitaxially grown with being doped with both Al and B, is laminated on the n$^+$-type substrate 1. Further, the first SiC epitaxial wafer (1, 2a, 3, 4) includes an n-type field stop layer 3, which is epitaxially grown with being doped with N etc. on the p-type buffer-layer region 2a, and an n$^-$-type voltage-blocking-layer 4 provided on the n-type field stop layer 3.

The minority-carrier lifetime of the p-type buffer-layer region 2a is about five nanoseconds or more and about 60 nanoseconds or less. In addition, as described in the explanation with the thickness t1 of the p-type buffer layer 2, a region with a constant thickness t2 is provided in a lower portion of the p-type buffer-layer region 2a, as a stock allowance required at the grinding or polishing process of the n$^+$-type substrate 1 for manufacturing a self-supporting epitaxial film.

In FIG. 4, a region with thickness t1 above the horizontal broken line delineated in the p-type buffer-layer region 2a is exemplified as a collector region. The thickness t2 as the stock allowance is set to, for example, about ten micrometers, and the thickness t1 of the p-type buffer layer 2, which serves as the collector region later, is set to about five micrometers or more and about 20 micrometers or less.

Next, a method of manufacturing the first SiC epitaxial wafer (1, 2a, 3, 4) will be described with reference to the flowchart of FIG. 5. First, in step S1, an n$^+$-type substrate 1 made of SiC is prepared and transferred into the epitaxial growth furnace. Next, in step S2, hydrogen (H$_2$) gas is introduced into the furnace, and the internal pressure of the furnace is adjusted to about 1,300 Pa to 40,000 Pa, and afterwards, the internal temperature of the furnace is raised to 1,600° C. to 1,700° C.

Next, in step S3, an SiC source gas is introduced, and in step S4, a main dopant gas containing Al, such as trimethyl Al (TMA) or the like as a main dopant for determining the conductivity type, is introduced. In step S5, an auxiliary dopant gas containing B such as triethyl B (TEB) or the like which captures minority-carriers is introduced. Steps S3 to S5 may be executed at the same time, or may be executed while shifting each timing such as executing step S5 slightly delayed from step S4. By the processes up to step S5, the p-type buffer-layer region 2a of the first SiC epitaxial wafer (1, 2a, 3, 4) is epitaxially grown.

Next, in step S6, both introduction of the main dopant gas and introduction of the auxiliary dopant gas are stopped, and in step S7, a gas containing N such as N$_2$ gas is introduced as a new dopant gas in parallel with introduction of the SiC source gas. Then, in step S8, the flow rate of the N$_2$ gas and the flow rate of the SiC source gas are adjusted so as to implement the n-type field stop layer 3. Afterwards, in step S9, the flow rate of the N$_2$ gas and the flow rate of the SiC source gas are adjusted so as to epitaxially grow the n$^-$-type voltage-blocking-layer 4.

Next, in step S10, the introduction of the SiC source gas and the dopant gas is stopped, internal temperature of the furnace is lowered, and inert gas is substituted. Afterwards, in step S11, the semiconductor wafer is transferred out of the furnace. By a series of the steps described above, the first SiC epitaxial wafer (1, 2a, 3, 4) illustrated in FIG. 4 is manufactured.

Figure 6A:
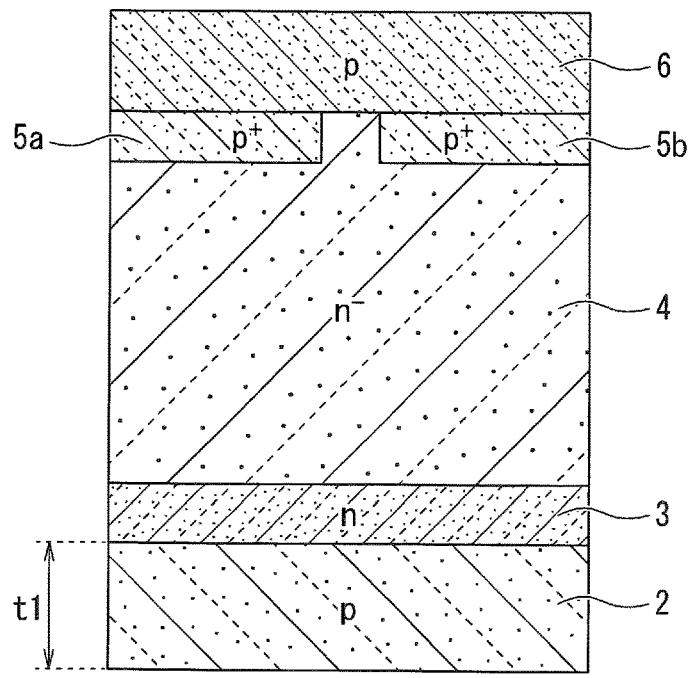
FIG. 6A is a process cross-sectional view explaining a method of manufacturing the silicon carbide insulated gate bipolar transistor according to the first embodiment (No. 1)

Next, the n$^+$-type substrate 1 of the first SiC epitaxial wafer (1, 2a, 3, 4) and the portion with thickness t2 of about ten micrometers below the p-type buffer-layer region 2a are removed by grinding or chemical mechanical polishing (CMP) or the like. As illustrated in FIG. 6A, the lower portion of the p-type buffer-layer region 2a is partially removed, so that a self-supporting epitaxial film with a p-type buffer layer 2, which has thickness t1 in the lower portion and serves as a collector region, is prepared.

Next, on the top surface of the n$^-$-type voltage-blocking-layer 4 in an upper portion of the self-supporting epitaxial film, a mask with opening portions patterned in desired shape is deposited. For example, the mask can be made from a silicon dioxide (SiO$_2$) film or the like with using a photolithography technique and an etching technique etc. Due to implanting Al ions or the like through the mask, and activating on the semiconductor wafer by heat treatment or the like, pt-type first base regions 5a, 5b with depth of about 0.5 micrometers are implemented in a portion of the surface of the upper portion of the n$^-$-type voltage-blocking-layer 4.

Next, as illustrated in FIG. 6A, a p-type epitaxial layer 6 with thickness of about 0.5 micrometers is laminated on the n$^-$-type voltage-blocking-layer 4 by epitaxial growth. Then, on a top surface of the p-type epitaxial layer 6, a mask with opening portions patterned in desired shape is laminated with an oxide film or the like by using a photolithography technique and an etching technique etc. Plasma etching or the like is performed by using the oxide film as a mask to implement a mesa region with depth of about 1.5 micrometers at a predetermined position, and after removing the mask, etching damage is cleared by sacrificial oxidation. The illustration of the mesa region is omitted.

Figure 6B:
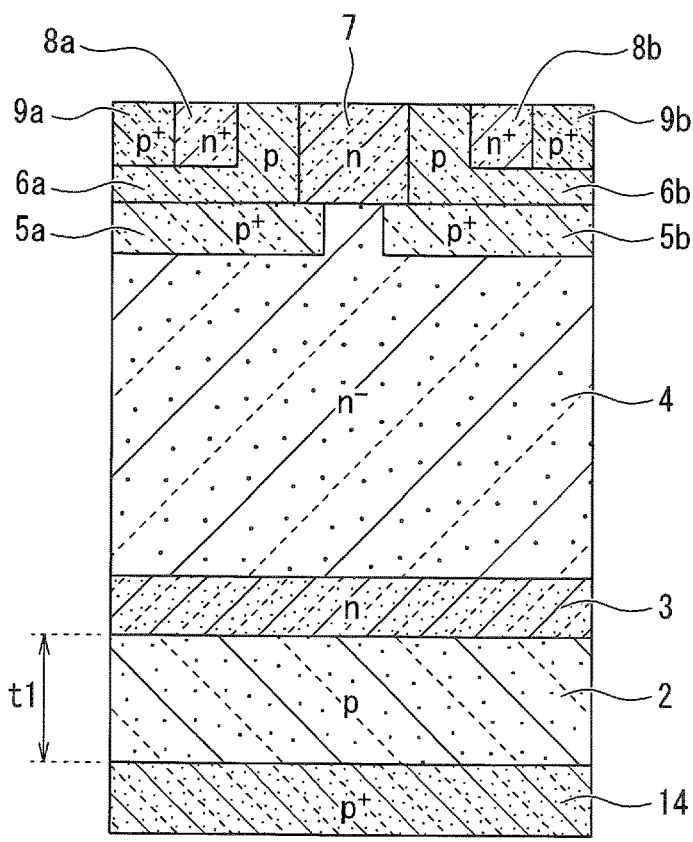
FIG. 6B is a process cross-sectional view explaining the method of manufacturing the silicon carbide insulated gate bipolar transistor according to the first embodiment (No. 2)

Next, a mask with a desired opening portion is laminated on the top surface of the p-type epitaxial layer 6 by a photolithography technique and an etching technique etc. with using resist, and n-type impurity element ions such as N are implanted by ion-implantation via the mask. As illustrated in FIG. 6B, by an ion-implantation method, a plurality of p-type second base regions 6a, 6b are locally implemented in a portion of a surface region of the p-type epitaxial layer 6, and an n-type base region 7 interposed between the p-type second base region 6a and the p-type second base region 6b is implemented. Then, the mask used for the ion-implantation for implementing the n-type base region 7 is removed.

Next, on surfaces of the p-type second base regions 6a, 6b, a mask with opening portions patterned in desired shape is laminated with a SiO$_2$ film or the like by photolithography technique and etching technique etc. Then, n-type impurity element ions such as phosphorus (P) are implanted by an ion-implantation method through the mask. By the ion-implantation, n$^+$-type emitter regions 8a, 8b are implemented in a portion of surface regions of the p-type second base regions 6a, 6b. Then, the mask used for the ion-implantation for implementing the n$^+$-type emitter regions 8a, 8b is removed.

Next, on the surfaces of the p-type second base regions 6a, 6b, a mask with opening portions patterned in desired shape is formed with a SiO$_2$ film or the like by photolithography technique and etching technique etc. Then, p-type impurity element ions such as Al are implanted by an ion-implantation method through the mask. By the ion-implantation, p$^+$-type first contact regions 9a, 9b are implemented in a portion of the surface regions of the p-type second base regions 6a, 6b. Then, the mask used for the ion-implantation for implementing the p$^+$-type first contact regions 9a, 9b is removed.

Next, masking and locally ion-implanting of p-type impurities, which are performed by use of photolithography technique and etching technique etc., are repeated so as to achieve a JTE structure as a breakdown voltage structure around the mesa region. The illustration of the JTE structure is omitted. By providing the mesa region and the JTE structure, the breakdown voltage of the first SiC-IGBT can be further increased. Afterwards, the semiconductor wafer is faced upside down, and as illustrated in FIG. 6B, p-type impurity element ions such as Al are implanted into a surface of the p-type buffer layer 2 on the side opposite to the n$^-$-type voltage-blocking-layer 4 so that a p$^+$-type second contact region 14 is implemented with depth of about 0.3 micrometers. Then, heat treatment as annealing for activating each region, which is implemented by the ion-implantation, is applied to the semiconductor wafer.

Figure 6C:
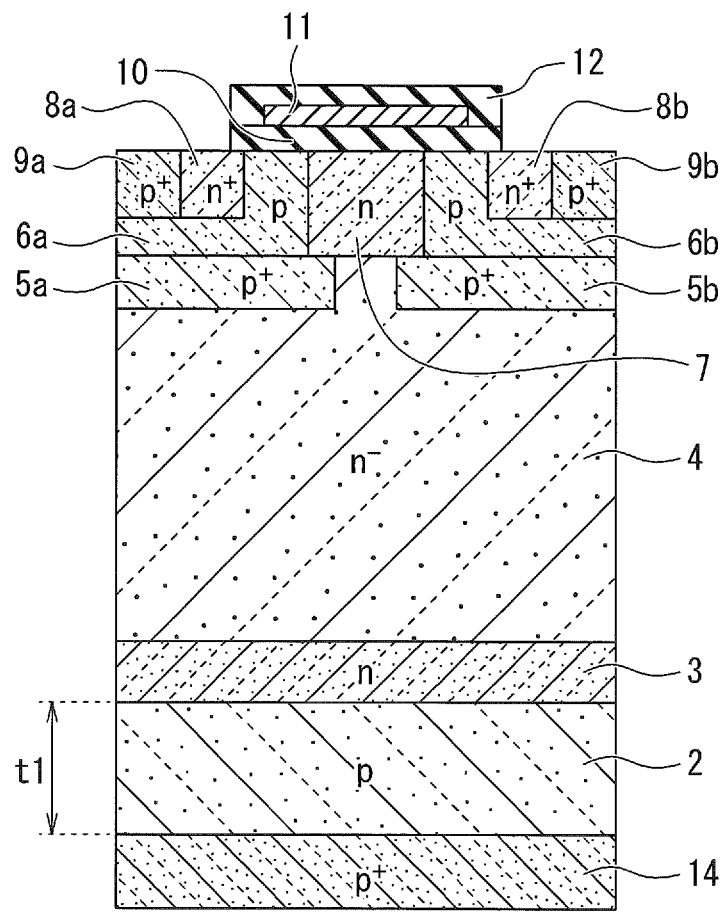
FIG. 6C is a process cross-sectional view explaining the method of manufacturing the silicon carbide insulated gate bipolar transistor according to the first embodiment (No. 3)

Next, an oxide film such as SiO$_2$ film is laminated on a top-surface side of the p-type epitaxial layer by thermal oxidation treatment or the like. Then, the laminated oxide film is patterned by using a photolithography technique and an etching technique etc. so as to implement a gate insulating film 10 as illustrated in FIG. 6C. Then, a polycrystalline silicon layer doped with n-type impurity elements is deposited on an entire top surface of the semiconductor wafer by low pressure CVD method or the like. Then, the deposited polycrystalline silicon layer is selectively removed by patterning with using a photolithography technique and a dry etching technique etc. so as to implement the gate electrode 11.

Next, an interlayer dielectric 12 such as a SiO$_2$ film is deposited by CVD method or the like so that the interlayer dielectric 12 covers the gate electrode 11. Then, the interlayer dielectric 12 is selectively removed and patterned, and contact-holes are dug to expose the n$^+$-type emitter regions 8a, 8b and the p$^+$-type first contact regions 9a, 9b through the contact-holes.

Next, an alloy film or the like, which contains Ni etc. as main component elements, is deposited both in the contact-hole and on the interlayer dielectric 12. The alloy film is patterned to be delineated in a predetermined shape by use of photolithography technique and etching technique etc. so that the emitter electrode 13 is implemented illustrated in FIG. 1. Furthermore, a metallic film which contains Al etc. is deposited on a surface of the p$^+$-type second contact region 14 on the side opposite to the n$^-$-type voltage-blocking-layer 4 so as to implement the collector electrode 15.

Afterwards, for example, heat treatment at temperature of about 1000° C. may be performed so that the n$^+$-type emitter regions 8a, 8b and the p$^+$-type first contact regions 9a, 9b ohmically contact to the emitter electrode 13. In addition, similarly, the p$^+$-type second contact region 14 and the collector electrode 15 may ohmically contact. A method of manufacturing the first SiC-IGBT is obtained by a series of the processes described above. In the method of manufacturing the first SiC-IGBT, the p-type buffer layer 2 is interposed between the n$^-$-type voltage-blocking-layer 4 and the collector electrode 15 and minority-carrier lifetime is controlled in the p-type buffer layer 2.

Example 1

Next, Example 1 using the method of manufacturing the first SiC-IGBT will be specifically described. First, an substrate made of n$^+$-type 4H—SiC, which was turned off by 4 degree in the <11-20> direction with thickness of 350 micrometers, was prepared and CMP was adapted on a Si surface of the substrate so as to manufacture n$^+$-type SiC substrate 1 with a diameter ($\phi$) of 4 inches. Then, the manufactured n$^+$-type substrate 1 was transferred into the epitaxial growth apparatus.

In an atmosphere of temperature of about 1,640° C. and pressure of about four kPa, hydrogen (H$_2$) was introduced at a flow rate of about 67.6 Pa·m$^3$/s (40 slm) and monosilane (SiH$_4$) was introduced at a flow rate of about 0.1014 Pa·m$^3$/s (60 sccm), respectively, as source gases. In addition, propane (C$_3$H$_8$) was introduced at a flow rate of about 3.38× 10$^{-2}$ (20 sccm), TMA was introduced at a flow rate of about 6.76 Pa·m$^3$/s (0.04 sccm), and TEB was introduced at a flow rate of about 3.38×10$^{-7}$ Pa·m$^3$/s (2×10$^{-4}$ sccm), respectively. Then, a single crystal layer of SiC was epitaxially grown for about two hours, and a p-type buffer layer 2 with thickness of about 30 micrometers was implemented on the Si surface side of the n$^+$-type substrate 1. The p-type buffer layer 2 was doped with Al at doping-concentration of about 1×10$^{18}$ cm$^{-3}$ and B at doping-concentration of about 5×10$^{16}$ cm$^{-3}$.

Next, the introduction of TMA and TEB which were included in the epitaxial growth conditions of the p-type buffer layer 2 was stopped, and N$_2$ gas was newly flowed at a flow rate of about 4.225×10$^{-2}$ Pa·m$^3$/s (25 sccm). In addition, the flow rate of SiH$_4$ was changed to about 0.16731 Pa·m$^3$/s (99 sccm), and the flow rate of C$_3$H$_8$ was changed to about 6.0839×10$^{-2}$ Pa·m$^3$/s (36 sccm). Furthermore, the same conditions of introduction of other source gases were maintained. Then, by epitaxial growth for about five minutes, an n-type field stop layer 3 with thickness of about 2.5 micrometers and being doped with N at doping-concentration of about 2×10$^{17}$ cm$^{-3}$ was implemented on the p-type buffer layer 2.

Next, the flow rate of N was changed to 3.38 Pa·m$^3$/s (0.02 sccm), and epitaxial growth was continued for about five hours. The n$^-$-type voltage-blocking-layer 4 doped with N at doping-concentration of about 1×10$^{14}$ cm$^{-3}$ was epitaxially grown at thickness of about 130 micrometers on the n-type field stop layer 3.

Next, a region with thickness of about 360 micrometers was removed from the lower portion of the first SiC epitaxial wafer (1, 2a, 3, 4). The 360 micrometers was a value which was obtained by adding the thickness t2 of ten micrometers as the stock allowance of the p-type buffer-layer region 2a to a value that was measured as the thickness of the n$^+$-type substrate 1 in advance. Then, a back surface of the p-type buffer-layer region 2a is grinded and CMP was adapted on the back surface. Next, mercury Capacitance Voltage (CV) measurement was executed on the ground surface or the polished surface after grinding or polishing. As a result, the polarity was p-type and the concentration was about 1×10$^{18}$ cm$^{-3}$ was confirmed, and that the p-type buffer layer 2 was exposed.

Next, by implanting Al ions with using an oxide film mask, p$^+$-type first base regions 5a, 5b were implemented in a portion of the n$^-$-type voltage-blocking-layer 4. The p$^+$-type first base regions 5a, 5b was doped with Al at doping-concentration of about 1×10$^{18}$ cm$^{-3}$ and had thickness of about 0.5 micrometers. Then, a p-type epitaxial layer 6 was implemented on the p$^+$-type first base regions 5a, 5b. The p-type epitaxial layer 6 was doped with Al at doping-concentration of about 5×10$^{15}$ cm$^{-3}$ and had thickness of about 0.5 micrometers.

Next, a mesa region with depth of about 1.5 micrometers was implemented by dry etching with CF$_4$ and O$_2$ plasma through the oxide film mask, and subsequently, etching damage was cleared by sacrificial oxidation. Next, p-type second base regions 6a, 6b were implemented by depositing an oxide film mask and implanting N ions, and an n-type base region 7 was implemented in a portion of the region interposed between adjacent p-type second base regions 6a, 6b. The n-type base region 7 were doped with N at concentration of about $2 \times 10^{16}$ cm$^{-3}$ and had depth of about one micrometer.

Next, by implanting P ions through the oxide film mask, n$^+$-type emitter regions 8a, 8b were implemented in a portion of the p-type second base regions 6a, 6b. The n$^+$-type emitter regions 8a, 8b were doped with P at concentration of about $1 \times 10^{20}$ cm$^{-3}$ and had depth of about 0.3 micrometers. Next, by implanting Al ions through the oxide film mask, p$^+$-type first contact regions 9a, 9b were implemented in a portion of the p-type second base regions 6a, 6b. The p$^+$-type first contact regions 9a, 9b were doped with Al at concentration of about $1 \times 10^{20}$ cm$^{-3}$ and had depth of about 0.3 micrometers.

Next, by implanting Al ions into the surface of the p-type buffer layer 2 on the side opposite to the n$^-$-type voltage-blocking-layer 4, a p$^+$-type second contact region 14 was implemented. The p$^+$-type second contact region 14 was doped with Al at concentration of about $1 \times 10^{20}$ cm$^{-3}$ and had depth of about 0.3 micrometers. Next, activation heat treatment was adapted at about 1,620° C. for about two minutes in an argon (Ar) atmosphere to activate the ions implanted into each layer. Next, after the gate insulating film 10 was deposited by wet oxidation, the gate electrode 11, the interlayer dielectric 12, the emitter electrode 13, and the collector electrode 15 were respectively laminated by each of predetermined processes so that the SiC-IGBT according to Example 1 was manufactured.

By the method of manufacturing the SiC-IGBT according to the first embodiment, the thickness t1, the Al concentration, and the B concentration of the p-type buffer layer 2 are simultaneously controlled to be values within certain ranges, so that minority-carriers are aggressively reduced. Therefore, in the forward operation of the IGBT using the self-supporting epitaxial film, even in a bipolar operation with a large current, excessive electrons are not injected into the vicinity of the collector electrode 15. Therefore, it is possible to manufacture an SiC-IGBT which can effectively prevent the occurrence of stacking faults expanding from the vicinity of the collector electrode 15.

In addition, in the method of manufacturing the SiC-IGBT according to the first embodiment, at the process of implementing the p-type buffer layer 2, boron, in which atomic radius is relatively small, is doped into the p-type buffer layer 2 at high density. Therefore, when the p-type buffer layer 2 is laminated on the n$^+$-type substrate 1, it is possible to suppress bow or warping of the first SiC epitaxial wafer (1, 2a, 3, 4) as compared with the case of doping Al only.

Furthermore, in the method of manufacturing the SiC-IGBT according to the first embodiment, after the process of removing the n$^+$-type substrate 1 from the first SiC epitaxial wafer (1, 2a, 3, 4), CV measurement or the like is executed on the surface of the wafer, which is ground and polished. By determining the polarity and concentration of the ground surface or the polished surface by the measurement, it is possible to confirm whether or not the n$^+$-type substrate 1 is completely removed, and to certainly secure the quality as a self-supporting epitaxial film.

Second Embodiment

[Silicon Carbide Epitaxial Wafer]

A silicon carbide epitaxial wafer for a silicon carbide insulated gate bipolar transistor according to a second embodiment (hereinafter, referred to as a "second SiC epitaxial wafer") will be described with reference to FIG. 7. The second SiC epitaxial wafer (1, 20, 2a, 3, 4) includes an n$^+$-type substrate 1 made of SiC, and a p-type buffer-layer region 2a provided on the n$^+$-type substrate 1.

The p-type buffer-layer region 2a is doped with Al at concentration of $5 \times 10^{17}$ cm$^{-3}$ or more and $5 \times 10^{18}$ cm$^{-3}$ or less and with B at concentration of $2 \times 10^{16}$ cm$^{-3}$ or more and less than $5 \times 10^{17}$ cm$^{-3}$. The p-type buffer-layer region 2a includes a collector region with thickness t1 of five micrometers or more and 20 micrometers or less. Similarly to the first SiC epitaxial wafer (1, 2a, 3, 4) illustrated in FIG. 4, in the second SiC epitaxial wafer (1, 20, 2a, 3, 4), the capturing and extinction of electrons as a minority-carrier are enhanced by the boron doped into the buffer layer.

The second SiC epitaxial wafer (1, 20, 2a, 3, 4) is different from the first SiC epitaxial wafer (1, 2a, 3, 4) in terms that the second SiC epitaxial wafer is further provided with a p$^-$-type concentration-moderating buffer-layer 20 between the n$^+$-type substrate 1 and the p-type buffer-layer region 2a. The p$^-$-type concentration-moderating buffer-layer 20 functions as a concentration-moderating buffer-layer for the purpose of suppressing bow or warping of the epitaxial wafer. The bow or warping is caused by the concentration difference in the process of laminating the p-type epitaxial growth film at high concentration on the n$^+$-type substrate 1.

The thickness of the p$^-$-type concentration-moderating buffer-layer 20 is set to one micrometer or more and ten micrometers or less. In a case that the thickness of the p$^-$-type concentration-moderating buffer-layer 20 is smaller than one micrometer, no effectiveness as a concentration-moderating buffer-layer is gained. In a case that the thickness is larger than ten micrometers, the cost for epitaxial growth and the cost of the grinding or polishing in the IGBT manufacturing process are remarkably increased.

The Al concentration of the p$^-$-type concentration-moderating buffer-layer 20 is set to a range of about $1 \times 10^{14}$ cm$^{-3}$ or more and about $1 \times 10^{17}$ cm$^{-3}$ or less. In addition, either in a case that the Al concentration is excessively low such as less than about $1 \times 10^{14}$ cm$^{-3}$, or in a case that the Al concentration is high such as exceeding about $1 \times 10^{17}$ cm$^{-3}$, the function of the concentration-moderating buffer-layer is lowered. The Al concentration is preferable to be distributed so as to be gradually increased from the n$^+$-type substrate 1 toward the p-type buffer-layer region 2a, because the function of the concentration-moderating buffer-layer is elevated. Each structure of members of the second SiC epitaxial wafer (1, 20, 2a, 3, 4) except for the p$^-$-type concentration-moderating buffer-layer 20 is equivalent to the structure of the corresponding members of the first SiC epitaxial wafer (1, 2a, 3, 4) with the same name respectively. Therefore, redundant description will be omitted.

<Method of Manufacturing Silicon Carbide Insulated Gate Bipolar Transistor>

Next, a method of manufacturing a silicon carbide insulated gate bipolar transistor according to a second embodiment using a second SiC epitaxial wafer (1, 20, 2a, 3, 4) as the semiconductor wafer (hereinafter, referred to as a "second SiC-IGBT") will be described. The structure of the second SiC-IGBT obtained by the manufacturing method is the same as the structure of the first SiC-IGBT illustrated in FIG. 1.

On the other hand, in the method of manufacturing the second SiC-IGBT, since the second SiC epitaxial wafer (1, 20, 2a, 3, 4) with the p$^-$-type concentration-moderating buffer-layer 20 is used, with respect to the process relating to the p⁻-type concentration-moderating buffer-layer 20, different structures from the structure included in the method of manufacturing the first SiC-IGBT are included. Therefore, processes relating to implementing and removing the p⁻-type concentration-moderating buffer-layer 20 will be mainly described, hereinafter.

Figure 5:
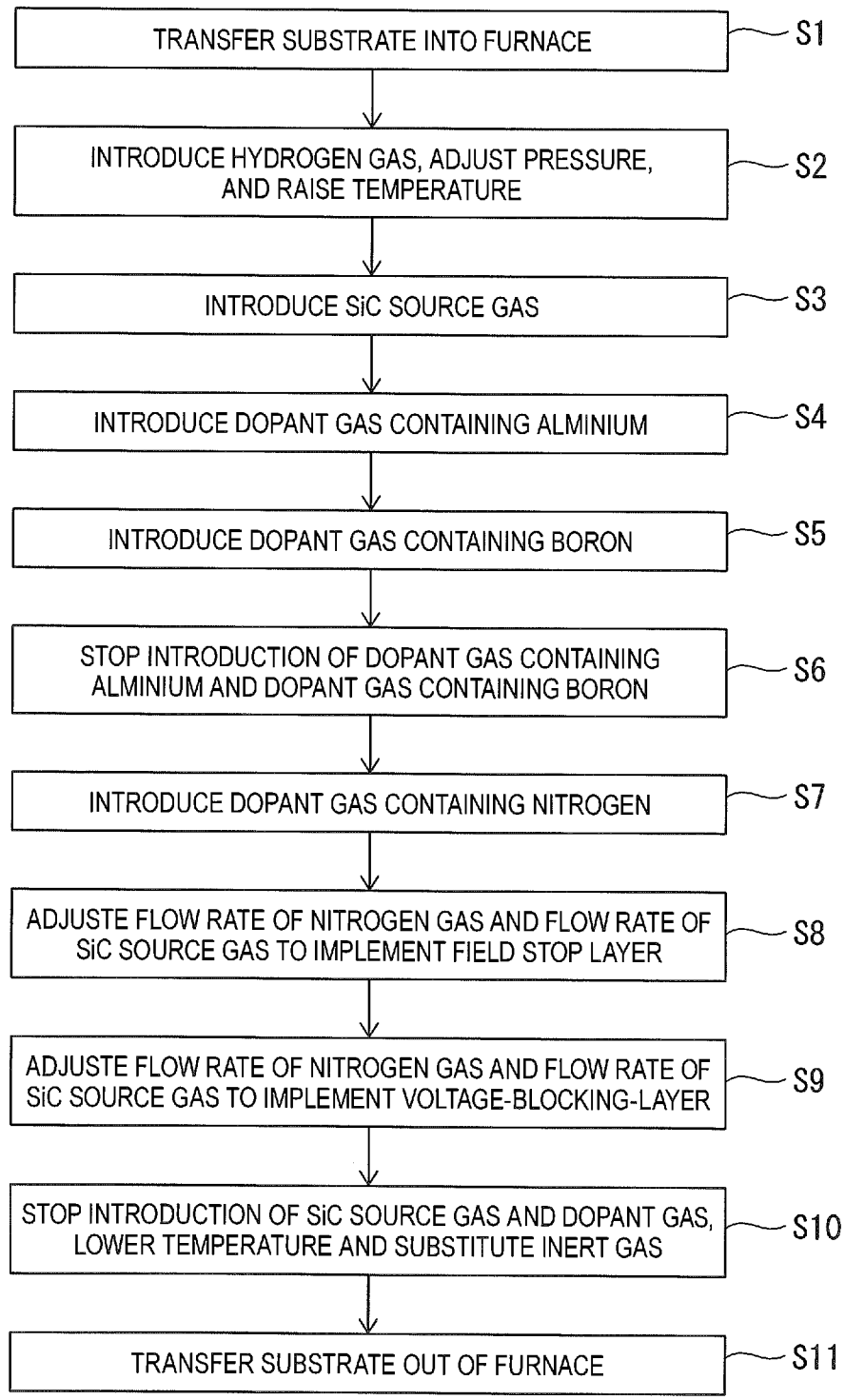
FIG. 5 is a flowchart illustrating a method of manufacturing the silicon carbide epitaxial wafer according to the first embodiment.
Figure 8:
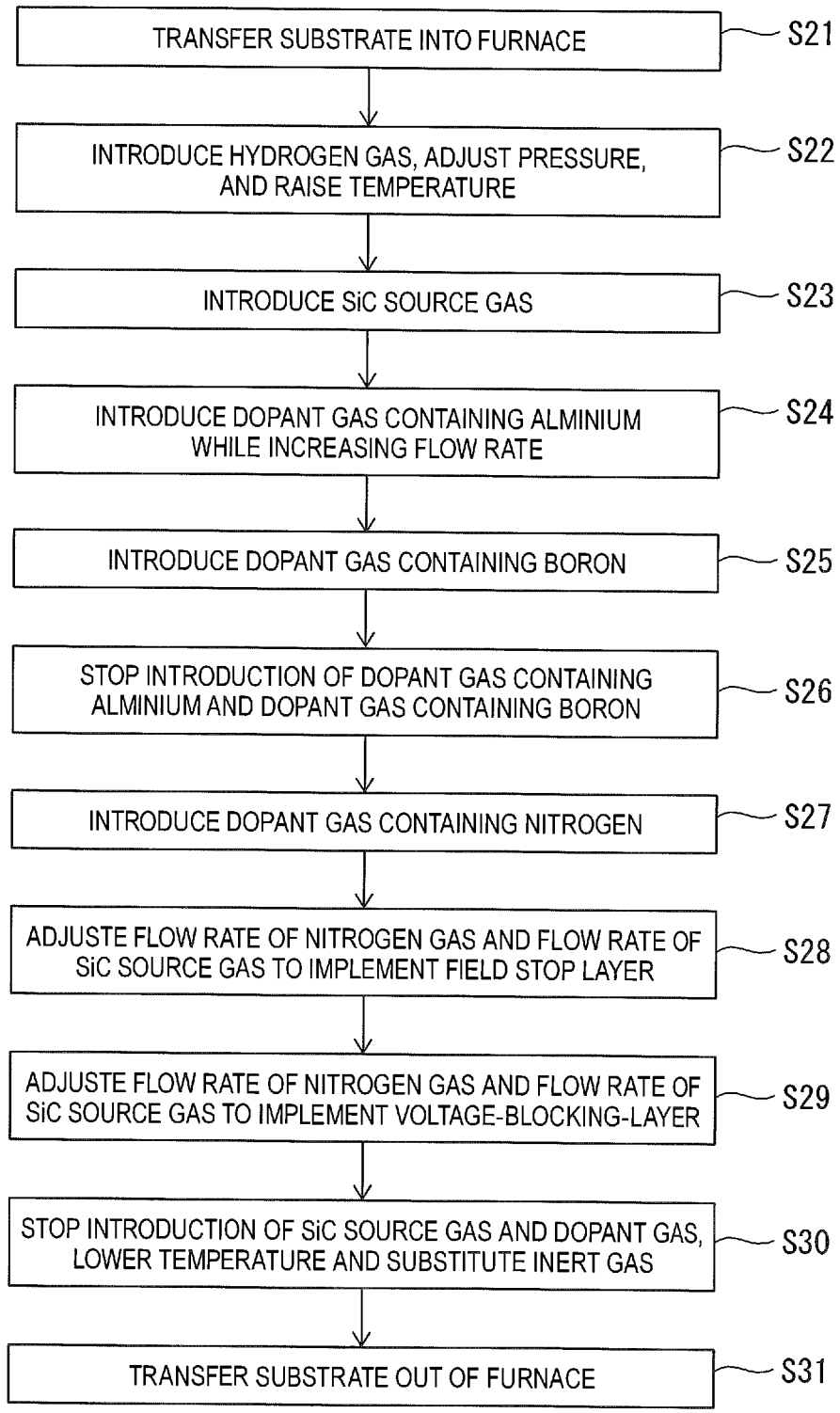
FIG. 8 is a flowchart illustrating a method of manufacturing the epitaxial wafer according to the second embodiment.

As compared between the flowchart of FIG. 8 and the flowchart illustrated in FIG. 5, a content of step S24 in the method of manufacturing the second SiC epitaxial wafer is different from the content of corresponding step S4 in the method of manufacturing the first SiC epitaxial wafer. Similarly to the case of the method of manufacturing the first SiC epitaxial wafer, in the method of manufacturing the second SiC epitaxial wafer, first, the processes from step S21 to step S23 are executed. The processes of steps S21 to S23 are equivalent to the processes of corresponding steps S1 to S3 in the method of manufacturing the first SiC epitaxial wafer.

Next, in step S24, during depositing, a main dopant gas such as TMA containing Al is introduced while a flow rate of the main dopant gas is gradually increased. Then, in step S25, while the flow rate of the main dopant gas is gradually increased step-by-step, dopant gases such as TEB containing B for capturing minority-carriers is introduced. By the processes of steps S24 and S25, the p⁻-type concentration-moderating buffer-layer 20 and the p-type buffer-layer region 2a are continuously implemented.

Figure 7:
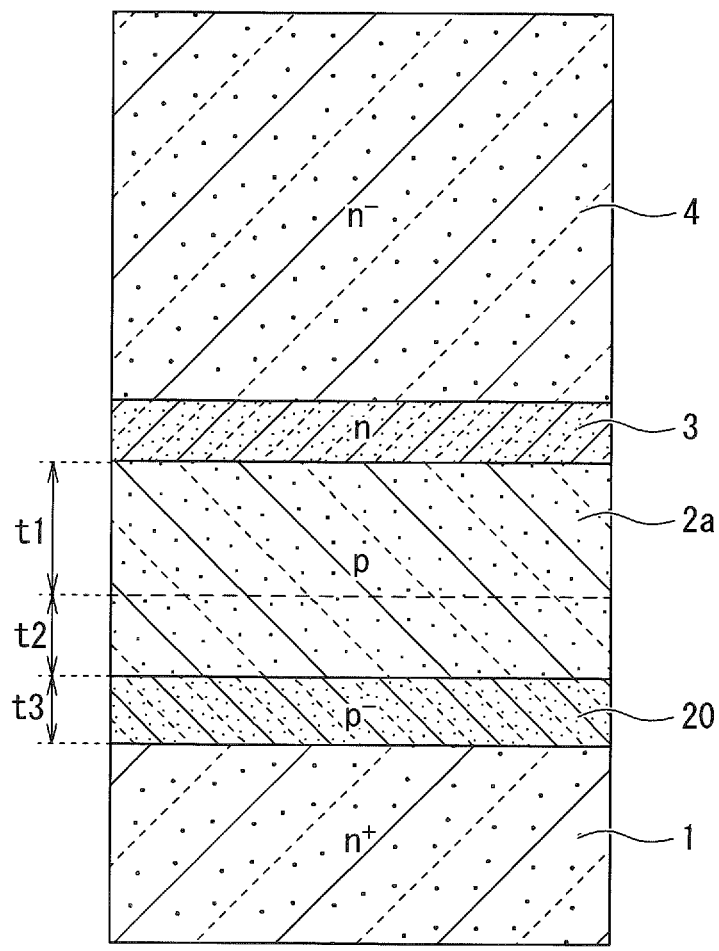
FIG. 7 is a cross-sectional view schematically illustrating an outline of an epitaxial wafer according to a second embodiment.

Then, by executing the processes of steps S26 to S31, the second SiC epitaxial wafer (1, 20, 2a, 3, 4) illustrated in FIG. 7 can be manufactured. The processes of steps S26 to S31 are equivalent to the processes of corresponding steps S6 to S11 in the method of manufacturing the first SiC epitaxial wafer.

Next, the n⁺-type substrate 1, the p⁻-type concentration-moderating buffer-layer 20, and a region with thickness t2 of about ten micrometers in the lower portion of the p-type buffer-layer region 2a of the second SiC epitaxial wafer (1, 20, 2a, 3, 4) are removed by grinding and CMP, or the like. By the removing, a self-supporting epitaxial film with a p-type buffer layer 2 in the lower portion is prepared.

Afterwards, similarly to the case of the method of manufacturing the first SiC-IGBT, respective element regions of the IGBT are implemented above the p-type buffer layer 2. The p-type buffer layer 2 as a collector layer contacts to the p⁺-type second contact region 14 on the ground surface side. The collector electrode 15 contacts to the bottom surface of the p⁺-type second contact region 14, so that a second SiC-IGBT can be obtained. In the second SiC-IGBT, the p-type buffer layer 2 is interposed between the n⁻-type voltage-blocking-layer 4 and the collector electrode 15 and minority-carrier lifetime is controlled in the p-type buffer layer 2.

Example 2

Next, Example 2 using the method of manufacturing the second SiC-IGBT will be described. First, an substrate made of n⁺-type 4H—SiC, which was turned off by 4 degree in the <11-20> direction with thickness of 350 micrometers, was prepared and CMP was adapted on a Si surface of the substrate so as to manufacture n⁺-type SiC substrate 1 with a diameter (φ) of 4 inches. Then, the manufactured n⁺-type substrate 1 was transferred into the epitaxial growth apparatus.

In an atmosphere of temperature of about 1,640° C. and pressure of about four kPa, hydrogen ($H_2$) was introduced at a flow rate of about 67.6 Pa·m³/s (40 slm) and monosilane ($SiH_4$) was introduced at a flow rate of about 0.1014 Pa·m³/s 60 sccm), respectively, as source gases. In addition, propane ($C_3H_8$) was introduced at a flow rate of about 3.38×10⁻² (20 sccm) and TMA was introduced at a flow rate of about 0.0001 to 0.004 sccm, and then, epitaxial growth was continued for about 20 minutes. By the epitaxial growth, a p⁻-type concentration-moderating buffer-layer 20 was implemented on the Si surface side of the n⁺-type substrate 1. The p⁻-type concentration-moderating buffer-layer 20 was doped with Al at doping-concentration of about 1×10¹⁵ cm⁻³ to about 1×10¹⁷ cm⁻³, and has thickness of about five micrometers.

Next, the TMA flow rate was increased to about 6.76 Pa·m³/s (0.04 sccm), and TEB was introduced at a flow rate of about 3.38×10⁻⁷ Pa·m³/s (2×10⁻⁴) sccm. Then, a single crystal layer of SiC was epitaxially grown for about two hours, an p-type buffer layer 2 was implemented on the Si surface side of the n⁺-type substrate 1. The p-type buffer layer 2 was doped with Al at doping-concentration of about 1×10¹⁸ cm⁻³ and B at doping-concentration of about 5×10¹⁶ cm⁻³, and has thickness of about 30 micrometers.

Next, the introduction of TMA and TEB included in the epitaxial growth conditions of the p-type buffer layer 2 was stopped, and $N_2$ gas was newly flowed at a flow rate of about 4.225×10⁻² Pa·m³/s (25 sccm). In addition, the flow rate of $SiH_4$ was changed to about 0.16731 Pa·m³/s (99 sccm), and the flow rate of $C_3H_8$ was changed to about 6.0839×10⁻² Pa·m³/s (36 sccm). As for the other source gases, the conditions of introduction were not changed and were maintained the same. Then, by depositing for about five minutes, a n-type field stop layer 3 with thickness of about 2.5 micrometers and doped with N at doping-concentration of about 2×10¹⁷ cm⁻³ was implemented on the p-type buffer layer 2. Next, the flow rate of N was changed to 3.38 Pa·m³/s (0.02 sccm), and epitaxial growth was continued for about five hours. The n⁻-type voltage-blocking-layer 4 doped with N at doping-concentration of about 1×10¹⁴ cm⁻³ was epitaxially grown at thickness of about 130 micrometers on the n-type field stop layer 3.

Next, a region with thickness of about 365 micrometers was removed from the lower portion of the semiconductor wafer. The 365 micrometers was a value which was obtained by adding the thickness t3 of about five micrometers of the p⁻-type concentration-moderating buffer-layer 20 and the thickness t2 of ten micrometers as the stock allowance of the p-type buffer-layer region 2a to a value that was measured as the thickness of the n⁺-type substrate 1 in advance. After grinding and CMP of the back surface of the semiconductor wafer, mercury CV measurement was executed on the ground surface or the polished surface. As a result of the measurement, the polarity was p-type and the concentration was about 1×10¹⁸ cm⁻³ was confirmed, and the p-type buffer layer 2 was exposed.

Afterwards, similarly to Example 1, the n⁻-type voltage-blocking-layer 4 was implemented in an upper portion of the n-type field stop layer 3 on the p-type buffer layer 2, and the p⁺-type first base regions 5a, 5b was implemented in an upper portion of the n⁻-type voltage-blocking-layer 4, by use of photolithography, etching, ion-implantation and the like, respectively. Then, after the p-type epitaxial layer 6 was grown on the p⁺-type first base regions 5a, 5b, the p-type second base regions 6a, 6b, the n-type base region 7, the n⁺-type emitter regions 8a, 8b, and p⁺-type first contact regions 9a, 9b were sequentially laminated. Furthermore, the gate insulating film 10, the gate electrode 11, the interlayer dielectric 12, the emitter electrode 13, the collector electrode 15, and the like were implemented, respectively, so that an SiC-IGBT according to Example 2 was manufactured.

Similarly to the case of the first embodiment, in the method of manufacturing the SiC-IGBT according to the second embodiment, the thickness t1, the Al concentration, and the B concentration of the p-type buffer layer 2 are simultaneously controlled to be values within certain ranges so as to aggressively reduce the minority-carriers. Therefore, in the forward operation of the IGBT using the self-supporting epitaxial film, even in a bipolar operation with a large current, excessive electrons are not injected into the vicinity of the collector electrode 15, and it is possible to manufacture an SiC-IGBT which can effectively prevent the occurrence of stacking faults expanding from the vicinity of the collector electrode 15.

Furthermore, in the method of manufacturing the SiC-IGBT according to the second embodiment, the SiC-IGBT is manufactured by using the second SiC epitaxial wafers (1, 20, 2a, 3, 4) in which the p$^-$-type concentration-moderating buffer-layer 20 is arranged between the n$^+$-type substrate 1 and the p-type buffer-layer region 2a. By using the p$^-$-type concentration-moderating buffer-layer 20, the SiC-IGBT can be manufactured from a semiconductor wafer in which bow or warping caused by concentration difference is suppressed, so that the quality of the SiC-IGBT can be improved. The other effectiveness of the method of manufacturing the SiC-IGBT according to the second embodiment are the same as the effectiveness of the method of manufacturing the SiC-IGBT according to the first embodiment.

Other Embodiments

While the present invention has been described by the above disclosed embodiments, it should be noted that the description and drawings constituting a portion of this disclosure do not limit the present invention. From the present disclosure, it should be noted that various alternative embodiments, examples, and operational techniques will be apparent to those skilled in the art.

For example, in the method of manufacturing the first and second SiC-IGBTs, the case that the p-type buffer layer 2, the n-type field stop layer 3 and the n$^-$-type voltage-blocking-layer 4 are continuously epitaxially grown in the same furnace to manufacture an epitaxial wafer has been described as an example. However, the method of epitaxially growing each layer of the epitaxial wafer is not limited the example. For example, each of growth furnaces of the p-type buffer layer 2, the n-type field stop layer 3, and the n$^-$-type voltage-blocking-layer 4 may be separately provided.

Here, for example, depending on an epitaxial growth furnace, components of dopant gases used for growing each layer might remain in the furnace after the growth process. Therefore, cross contamination of the dopants due to residual components may be concerned when each layer is to be continuously grown in the same furnace. However, by preparing separate growth furnaces of the respective layers, cross-contamination of the dopants can be prevented. For example, when the growth furnaces of the respective layers are separated, the step S10 as the process of implementing the p-type buffer layer 2 may be executed after the step S5 in the method of manufacturing the first SiC-IGBT. In addition, at the time of growing the n-type field stop layer 3 and the n$^-$-type voltage-blocking-layer 4, the processes following the step S8 may be executed after the steps S1 to S3.

Furthermore, for example, the timing of removing the n$^+$-type substrate 1 from the SiC epitaxial wafer is not limited to the timing before implementing the surface structure of the device. The timing may be appropriately changed to timing after implementing the surface structure of the device, for example. By shifting the timing of removing to later side in the total processes, it is possible to suppress the risk of cracking due to thinning the semiconductor wafer excessively when the n$^+$-type substrate 1 is removed during the manufacturing process. However, the n$^+$-type substrate 1 needs to be removed before implementing the p$^+$-type second contact region and the collector electrode 15.

In the methods of manufacturing the first and second SiC-IGBTs, although the p-type epitaxial layer 6 which is epitaxially grown by the epitaxial growth method is used as the p-type semiconductor region for implementing the p-type second base regions 6a, 6b, the present invention is not limited the method. For example, p-type impurity elements ion may be implanted into the n$^-$-type voltage-blocking-layer so as to implement a p-type semiconductor region.

In the methods of manufacturing the first and second SiC-IGBTs, the case that the p$^+$-type second contact region 14 is provided under the p-type buffer layer 2 has been described. However, if ohmic junction is sufficiently achieved between the p-type buffer layer 2 and the collector electrode 15, the p$^+$-type second contact region 14 may be omitted.

Although the first and second SiC-IGBTs are exemplified as planar type IGBTs, the same effectiveness can be obtained even in a vertical type IGBT with a trench gate. As described above, the present invention includes various embodiments and the like not described above, and the technical scope of the present invention is defined only by the present invention specifying matters relating to the claims from the above description.

What is claimed is:

1. A silicon carbide insulated gate bipolar transistor comprising:
    a p-type collector layer being silicon carbide, the p-type collector layer having a thickness of five micrometers or more and 20 micrometers or less, the p-type collector layer being doped with aluminum at an impurity concentration of $5\times10^{17}$ cm$^{-3}$ or more and $5\times10^{18}$ cm$^{-3}$ or less, and being doped with boron at an impurity concentration of $2\times10^{16}$ cm$^{-3}$ or more and less than $5\times10^{17}$ cm$^{-3}$;
    an n-type voltage-blocking-layer being provided on the p-type collector layer;
    a p-type base region being provided on the n-type voltage-blocking-layer;
    an n-type emitter region being provided in an upper portion of the p-type base region;
    a gate insulating film being provided in an upper portion of the n-type voltage-blocking-layer; and
    a gate electrode being provided on the gate insulating film,
    wherein the boron doped into the p-type collector layer enhances capturing and extinction of electrons as a minority-carrier.

2. The silicon carbide insulated gate bipolar transistor according to claim 1,
    wherein an electron density reaching a bottom surface of the p-type collector layer is $2\times10^{15}$ cm$^{-3}$ or less in forward electric conduction.

3. The silicon carbide insulated gate bipolar transistor according to claim 1, wherein the n-type voltage-blocking-layer has a thickness of 250 micrometers or less and is doped with nitrogen at an impurity concentration of $1\times10^{15}$ cm$^{-3}$ or less.

4. The silicon carbide insulated gate bipolar transistor according to claim 3,
wherein the thickness of the n-type voltage-blocking-layer is 100 micrometers or more.

5. The silicon carbide insulated gate bipolar transistor according to claim 1,
wherein a lifetime of a minority-carrier in the p-type collector layer is 60 nanoseconds or less.

6. A silicon carbide epitaxial wafer comprising:
a substrate being silicon carbide; and
a p-type buffer layer being provided on the substrate, the p-type buffer layer having a thickness of five micrometers or more and 20 micrometers or less, the p-type buffer layer having a collector region which is doped with aluminum at an impurity concentration of $5\times10^{17}$ cm$^{-3}$ or more and $5\times10^{18}$ cm$^{-3}$ or less and which is doped with boron at an impurity concentration of $2\times10^{16}$ cm$^{-3}$ or more and less than $5\times10^{17}$ cm$^{-3}$,
wherein the boron doped into in the p-type buffer layer enhances capturing and extinction of electrons as a minority-carrier.

7. The silicon carbide epitaxial wafer according to claim 6,
wherein the p-type buffer layer further having includes a region which is provided between the collector region and the substrate, the p-type buffer layer having a thickness of ten micrometers as a stock allowance requested for grinding or polishing the substrate.

8. The silicon carbide epitaxial wafer according to claim 6, further comprising:
an n-type voltage-blocking-layer being provided on the p-type buffer layer, having a thickness of 250 micrometers or less, the n-type voltage-blocking-layer being doped with nitrogen at an impurity concentration of $1\times10^{15}$ cm$^{-3}$ or less.

9. The silicon carbide epitaxial wafer according to claim 8,
wherein the thickness of the n-type voltage-blocking-layer is 100 micrometers or more.

10. The silicon carbide epitaxial wafer according to claim 6, further comprising:
a p$^-$-type concentration-moderating buffer-layer being provided between the substrate and the p-type buffer layer, the p$^-$-type concentration-moderating buffer-layer having an impurity concentration lower than an impurity concentration of the p-type buffer layer.

11. The silicon carbide epitaxial wafer according to claim 6,
wherein a lifetime of a minority-carrier in the p-type buffer layer is 60 nanoseconds or less.

* * * * *

UNITED STATES PATENT AND TRADEMARK OFFICE
CERTIFICATE OF CORRECTION

PATENT NO. : 10,522,667 B2
APPLICATION NO. : 15/963698
DATED : December 31, 2019
INVENTOR(S) : Takeshi Tawara et al.

It is certified that error appears in the above-identified patent and that said Letters Patent is hereby corrected as shown below:

In the Claims

Column 17, Line 26 (approx.), In Claim 7, after "further" delete "having".

Signed and Sealed this
Eighteenth Day of February, 2020

Andrei Iancu
*Director of the United States Patent and Trademark Office*